US011563424B2

United States Patent
Forest et al.

(10) Patent No.: US 11,563,424 B2
(45) Date of Patent: Jan. 24, 2023

(54) METHOD AND DEVICE FOR DETERMINING THE PHASE SHIFT BETWEEN TWO SIGNALS

(71) Applicant: STMICROELECTRONICS SA, Montrouge (FR)

(72) Inventors: Jeremie Forest, Villard Bonnot (FR); Vincent Knopik, Crets en Belledonne (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 17/496,548

(22) Filed: Oct. 7, 2021

(65) Prior Publication Data

US 2022/0116024 A1    Apr. 14, 2022

(30) Foreign Application Priority Data

Oct. 9, 2020 (FR) ...................... 2010322

(51) Int. Cl.
  *H03H 11/16* (2006.01)
  *H03F 3/24* (2006.01)
  (Continued)

(52) U.S. Cl.
  CPC ............. *H03H 11/16* (2013.01); *H03F 3/245* (2013.01); *H04B 1/3827* (2013.01);
  (Continued)

(58) Field of Classification Search
  CPC ............... G01R 25/04; H03F 2200/435; H03F 2200/451; H03F 3/245; H03H 11/16; H04B 1/3827; H04W 84/042
  See application file for complete search history.

(56) References Cited

U.S. PATENT DOCUMENTS 10,491,198 B1   11/2019 Dinc et al.
2006/0017521 A1*  1/2006 Downs ................. H01P 5/04
                                                       333/100
(Continued)

FOREIGN PATENT DOCUMENTS

WO    2020152401 A1    7/2020

OTHER PUBLICATIONS

Aryanfar, F. et al., "An Amplitude-Based Phase Detector at MM-Wave Frequency Range," 2011 IEEE MTT-S International Microwave Symposium, Aug. 4, 2011, 4 pages.
(Continued)

*Primary Examiner* — Nguyen T Vo
(74) *Attorney, Agent, or Firm* — Slater Matsil, LLP

(57) ABSTRACT

In an embodiment, a method for determining the phase shift between a first signal and a second signal includes: delivering the first signal to a first input of a 90° hybrid coupler; delivering the second signal to a second input of the 90° hybrid coupler; determining a first piece of information relating to a power of a first output signal delivered to a first output of the 90° hybrid coupler; determining a second piece of information relating to a power of a second output signal delivered to a second output of the coupler; and adjusting the phase of the second signal until obtaining a calibrated phase for which the first piece of information is substantially equal to the second piece of information, wherein the first and second signals have identical frequencies, and wherein the phase shift between the first signal and the second signal is equal to the calibrated phase.

20 Claims, 4 Drawing Sheets

(51) Int. Cl.
*H04B 1/3827* (2015.01)
*H04W 84/04* (2009.01)
(52) U.S. Cl.
CPC .. *H03F 2200/435* (2013.01); *H03F 2200/451* (2013.01); *H04W 84/042* (2013.01)

(56) References Cited

U.S. PATENT DOCUMENTS

2009/0108930 A1* 4/2009 Gandhi .................... H03F 3/68
 330/56
2013/0241640 A1* 9/2013 Lin ......................... H03F 3/602
 330/124 R

OTHER PUBLICATIONS

Wikipedia, "Gilbert cell," https://en.wikipedia.org/w/index.php?title=Gilbert_cell&oldid=980511519, Jul. 6, 2021, 2 pages.

* cited by examiner

METHOD AND DEVICE FOR DETERMINING THE PHASE SHIFT BETWEEN TWO SIGNALS

CROSS-REFERENCE TO RELATED APPLICATIONS

This application claims the benefit of French Patent Application No. 2010322, filed on Oct. 9, 2020, which application is hereby incorporated herein by reference.

TECHNICAL FIELD

The present disclosure relates generally to an electronic system and method, and, in particular embodiments, to method and device for determining the phase shift between two signals.

BACKGROUND

Generally, an electronic device dedicated to the transmission of information comprises a transmission chain including several transmission lines each connected to an antenna. Each transmission line performs spatial filtering operations (beamforming) allowing to control the phase and amplitude of the signals emitted by each antenna of the device to create constructive or destructive interference between the emitted electromagnetic waves.

In this regard, it is consequently advantageous to be able to determine the phase shifts between different signals conveyed on the different transmission lines.

Conventional phase detectors generally include either analog components such as analog multipliers or digital circuits such as logic gates or flip-flops.

However, such detectors are not adapted for applications in the radiofrequency field, in particular in the field of millimeter bands.

SUMMARY

There is a need to provide a low complexity technical solution allowing to determine the phase shift between two signals in particular for very high frequency applications such as those considered in 5G technology.

Some embodiments relate to the transmission of information, in particular for the radiofrequency applications considered for 5G technology. Some embodiments relate to the determination of the phase shift between two signals, such as two radiofrequency (RF) signals.

Some embodiments apply advantageously but in a non-limiting manner to the technology of beamforming for the directional emission of signals.

According to one implementation and embodiment, a solution is proposed which can be easily implemented in an integrated circuit manufacturing method, with a non-invasive topology therefore having no influence on the power supply lines, and having a low consumption.

According to one implementation and embodiment, it is proposed to determine the phase shift between two signals without actual phase calculation.

In this regard, according to one implementation and embodiment, it is proposed to use a hybrid coupler.

Thus, according to one aspect, provision is made of a method for determining the phase shift between a first signal and a second signal, in particular radiofrequency signals. In some embodiments, both the first and second signals have the same frequency.

In some embodiments, the second signal has an adjustable phase.

In some embodiments, the method according to this aspect then comprises:
delivering the first signal to a first input of a 90-degree hybrid coupler,
delivering the second signal to a second input of the hybrid coupler,
determining a first piece of information relating to the power of a first output signal delivered to a first output of the coupler,
determining a second piece of information relating to the power of a second output signal delivered to a second output of the coupler, and
adjusting the phase of the second signal until obtaining a calibrated phase for which said first piece of information is equal or substantially equal, within a tolerance, to the second piece of information.

In some embodiments, the tolerance depends on the sensitivity of the means used to obtain the two pieces of information, for example peak detectors, and on that of the comparator used to compare the two pieces of information.

As an indication, in some embodiments, the order of magnitude of this sensitivity is between 10 mV and 20 mV.

The phase shift between the first signal and the second signal is then equal to the calibrated phase.

Thus, the phase shift is determined without any phase calculation but simply by adjusting the phase of the second signal until obtaining an equality within a tolerance between the two power pieces of information of the two output signals.

Although it is possible to determine the pieces of information relating to the power of the signal in any manner known to the person skilled in the art, it is particularly advantageous that the determination of the first piece of information comprises a determination of the peak value of the DC voltage of the first output signal and that the determination of the second piece of information also comprises a determination of the peak value of the DC voltage of the second output signal.

Obtaining the calibrated phase then advantageously corresponds to a difference which is zero or substantially zero (e.g., with a tolerance of around 10 mV to 20 mV between the two peak values).

The use of the DC voltage of the output signals is particularly advantageous because it does not cause attenuation of the radiofrequency signal.

According to another aspect, provision is made of a device for determining the phase shift between a first signal and a second signal, the two signals having an identical frequency, the second signal having an adjustable phase.

The device according to this aspect comprises:
a 90° hybrid coupler having a first input to receive the first signal, a second input to receive the second signal,
a first circuit configured to determine a first piece of information relating to the power of a first output signal delivered to a first output of the coupler,
a second circuit configured to determine a second piece of information relating to the power of a second output signal delivered to a second output of the coupler,
a processor configured to analyze the first piece of information and the second piece of information relative to each other, and
an adjustment circuit configured to adjust the phase of the second signal until obtaining a calibrated phase for which the first piece of information is equal or substantially equal to the second piece of information.

The phase shift between the first signal and the second signal is then equal to the calibrated phase.

According to one embodiment, the first circuit comprises a first peak detector coupled to the first output and configured to determine the peak value of the DC voltage of the first output signal. The second circuit comprises a second peak detector coupled to the second output and configured to determine the peak value of the DC voltage of the second output signal. The processor is then configured to determine a difference between the two peak values, the calibrated phase corresponding to a zero or substantially zero difference within a tolerance.

In some embodiments, in order to ensure a symmetry of the device, which may be particularly advantageous in the context of radiofrequency applications, it is advantageously provided that the device further comprises two other peak detectors respectively coupled to the first input and to the second input of the coupler.

According to another aspect, provision is made of a communication apparatus, for example a cellular mobile telephone, comprising at least one emission chain including a power amplifier, and at least one device as defined above, disposed upstream or downstream of the power amplifier.

This allows for example to determine the phase shift introduced by the components located upstream and/or downstream of the power amplifier, so as to correct it.

BRIEF DESCRIPTION OF THE DRAWINGS

Other advantages and features of the invention will become apparent upon examining the detailed description of the embodiments and implementations, which is in no way limiting, and the appended drawings wherein.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Figure 1:
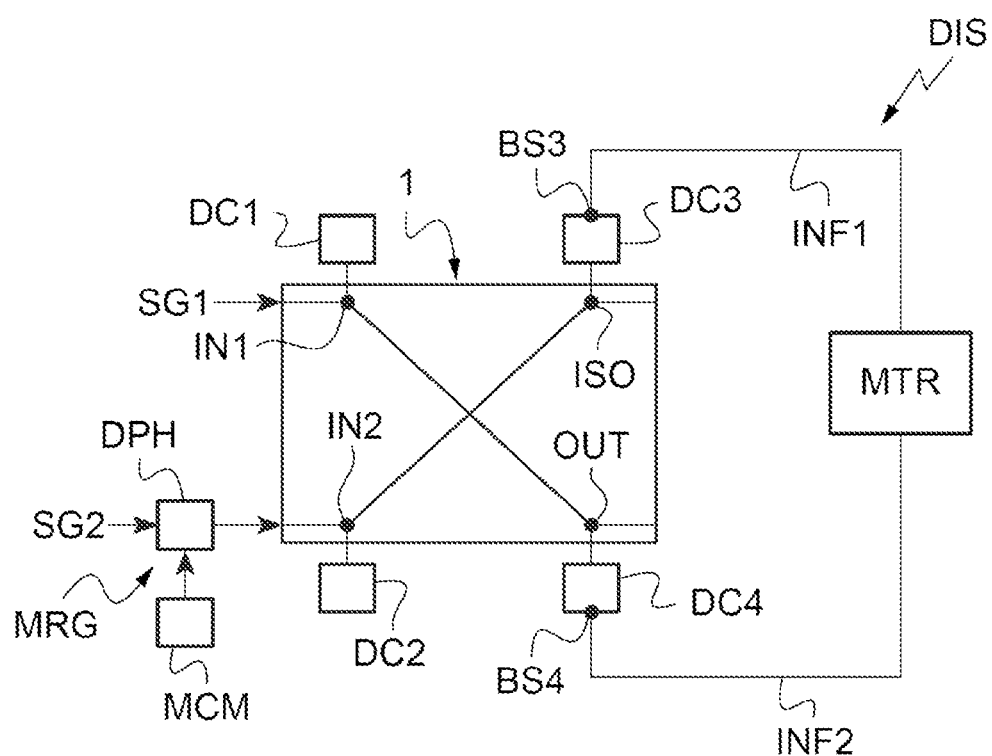
FIGS. 1 to 5 schematically illustrate embodiments and implementations of the invention.

In FIG. 1, the reference DIS denotes a device allowing to determine the phase shift between a first signal SG1 and a second signal SG2.

In this example, the two signals SG1 and SG2 are radiofrequency signals.

As an indication, in some embodiments, the frequency of these two signals is comprised between 10 GHz and 80 GHz and these signals can be used in 5G technology.

In some embodiments, the two signals SG1 and SG2 have the same frequency.

The second signal SG2 has an adjustable phase.

The device DIS comprises a 90° hybrid coupler, referenced 1, having a first input IN1 to receive the first signal SG1 and a second input IN2 to receive the second signal SG2.

The structure of a 90° hybrid coupler is well known to the person skilled in the art and includes in particular quarter wave transmission lines, adapted to the frequency of the signals SG1 and SG2.

The device DIS also includes a first circuit DC3, here a peak detector, an exemplary structure of which will be detailed below, configured to determine a first piece of information INF1 relating to the power of a first output signal delivered to a first output ISO of the coupler 1.

The device DIS also includes a second circuit DC4, here a peak detector, configured to determine a second piece of information INF2 relating to the power of a second output signal delivered to a second output OUT of the coupler 1.

The device DIS also includes a processing circuit MTR, for example based on logic gates, configured to analyze the first piece of information INF1 and the second piece of information INF2 relative to each other.

The device DIS also includes an adjustment circuit MRG configured to adjust the phase of the second signal SG2.

The adjustment circuit MRG includes a phase shifter DPH, (of conventional and known structure), controlled by a control circuit MCM.

Figure 2:
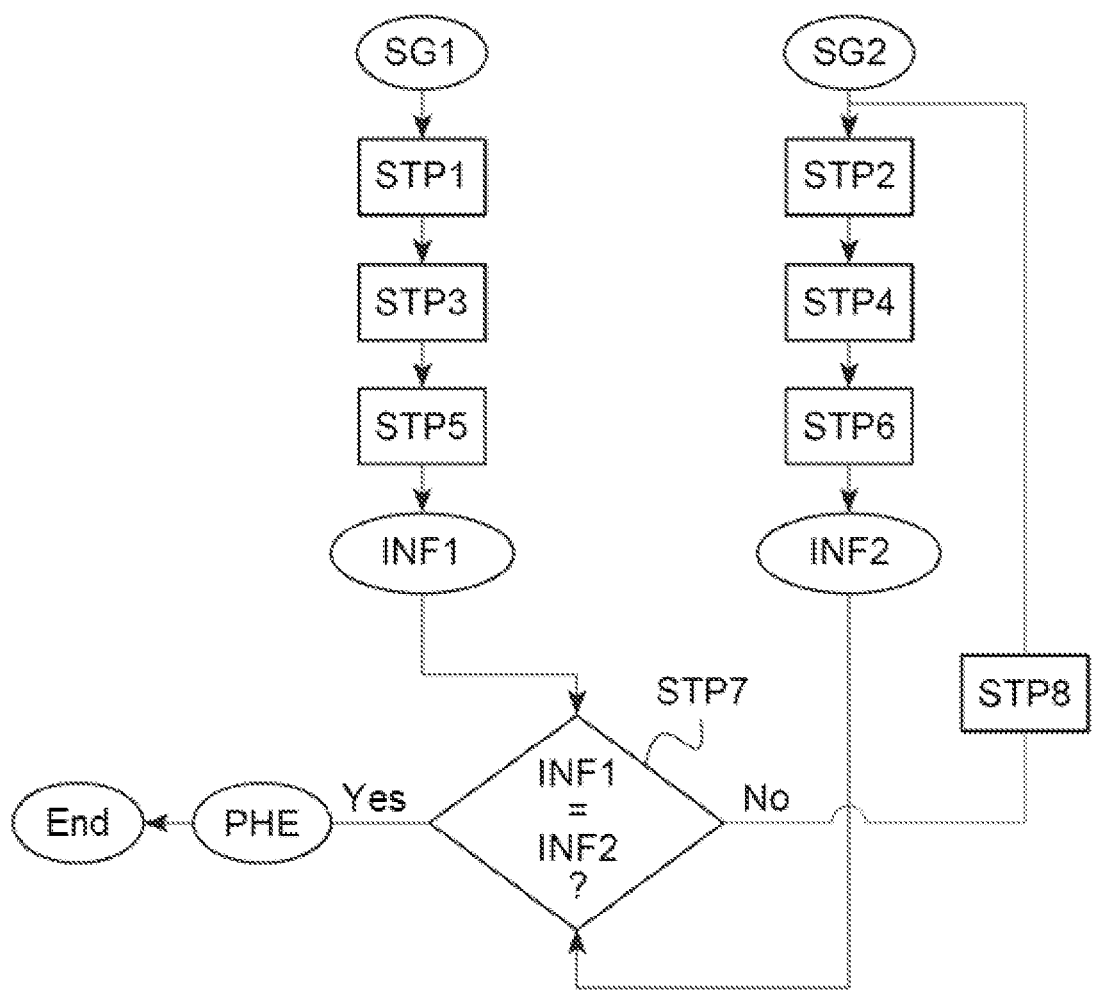

Reference is now made more particularly to FIG. 2 to describe an example of the implementation of a method allowing to determine the phase shift between the two signals SG1 and SG2.

In step STP1, the first signal SG1 is delivered to the first input IN1 of the hybrid coupler 1.

In a step STP2, the second signal SG2 is delivered to the second input IN2 of the coupler 1.

In step STP3, the hybrid coupler 1 delivers a first output signal to the output ISO.

In step STP4, the hybrid coupler 1 delivers a second output signal to the output OUT.

The first circuit DC3 then determines in step STP5 the first piece of information INF1, and the second circuit DC4 determines in step STP6 the second piece of information INF2.

The processing circuit MTR then analyses in step STP7 the pieces of information INF1 and INF2 relative to each other.

If there is equality between these two pieces of information within a tolerance, for example equal to a few mV, then the two signals SG1 and SG2 are considered to be in phase.

If, on the other hand, the two pieces of information INF1 and INF2 are not equal, then the adjustment circuit MRG adjusts the phase of the signal SG2 in step STP8.

In this regard, the control circuit MCM can send to the phase shifter DPH a control signal so as to increment or decrement the initial phase of the signal SG2 by a given phase pitch, for example 5°.

The signal SG2 having its phase modified is then delivered again in step STP2, and steps STP4 and STP6 are repeated so as to obtain a new second piece of information INF2.

And, in step STP7, as long as the two pieces of information INF1 and INF2 are not equal within the tolerance, step STP8 is repeated by incrementing, for example, each time, the phase of signal SG2 by the selected phase pitch.

And, when in step STP7, the two pieces of information INF1 and INF2 are equal within the tolerance, the signal SG2 has been phase-shifted by a phase PHE called the calibrated phase, relative to its initial phase. This phase PHE is equal to the difference between the final phase of the signal SG2 and its initial phase, that is to say for example the product of the pitch number by the value of the phase pitch. And the equality between the two pieces of information INF1 and INF2 means that the phase-shifted signal SG1 of the phase PHE is in phase with the phase-shifted signal SG1.

The calibrated phase PHE corresponds to the phase shift between signal SG1 and signal SG2 before its phase is adjusted.

This value PHE can be obtained by the value of the phase shift introduced by the phase shifter DPH.

Figure 3:
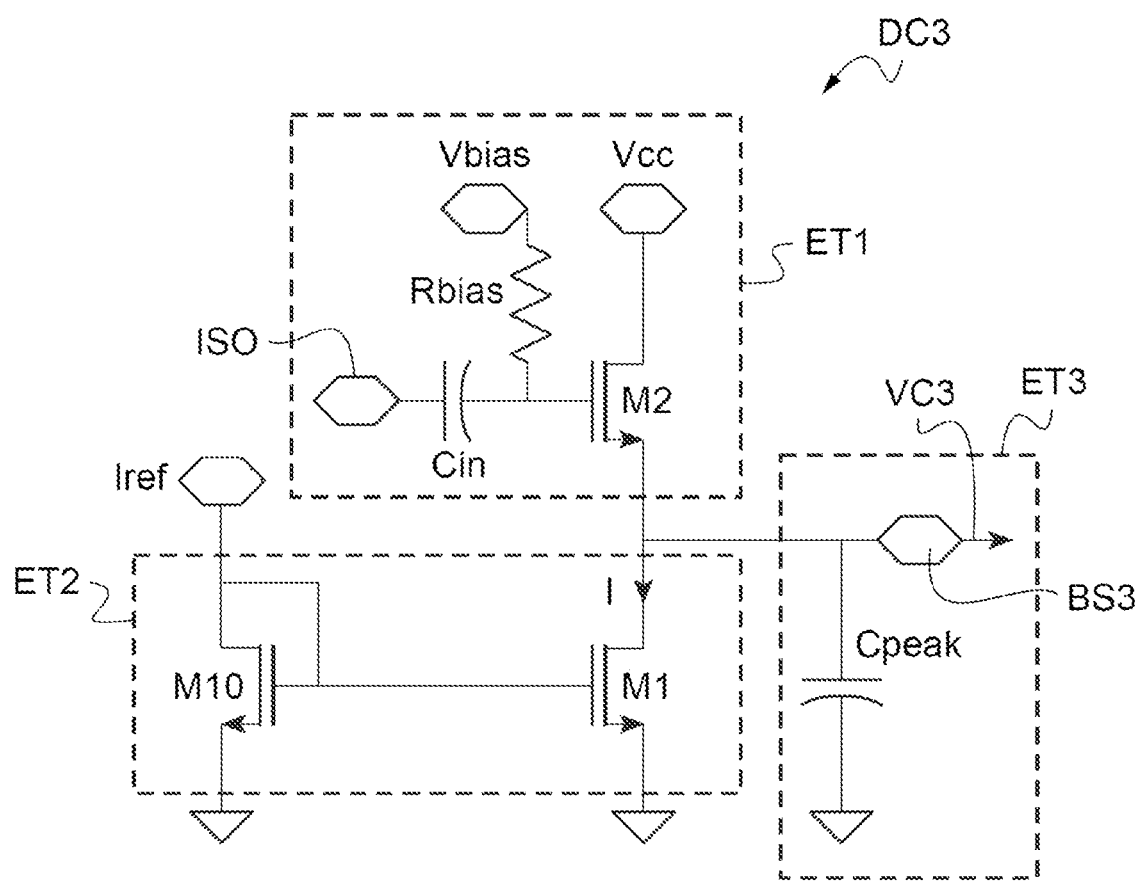

FIG. 3 illustrates an example of the structure of a peak detector DCi, for example the peak detector DC3, it being understood that the other peak detectors advantageously may have the same structure.

The detector DC3 includes a first radiofrequency stage ET1 including a capacitor Cin, one terminal of which is connected to the output ISO terminal of the coupler 1 and the second terminal of which is connected to the gate of a MOS transistor M2.

The gate of this transistor M2 is biased using a resistor Rbias connected to a bias voltage Vbias.

And the source of the transistor M2 is connected to the output terminal BS3 of the peak detector DC3.

The peak detector DC3 also includes a second stage ET2 including a current mirror based on two NMOS transistors M0 and M1 the input of which receives a reference current Iref and the output of which is also connected to the output terminal BS3 of the detector DC3.

Finally, the detector DC3 includes a direct current output stage ET3 including a capacitor Cpeak connected between the output terminal BS3 and the ground.

The detector DC3 delivers at the output the peak value VC3 of the DC voltage of the output signal delivered to the output BS3.

It should be noted that, as illustrated in FIG. 1, that coupling two other peak detectors DC1 and DC2 on the two input terminals IN1 and IN2 is optional but may be particularly advantageous in the case of a radiofrequency application because this symmetrizes the structure of the coupler.

Figure 4:
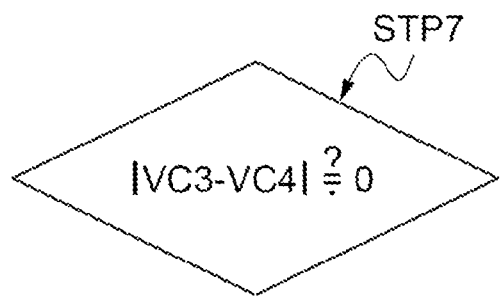

In the case where peak detectors are used, the analysis carried out in step STP7 by the processing circuit then includes, as schematically illustrated in FIG. 4, a determination of the absolute value of the difference between the peak value VC3 of the DC voltage of the output signal delivered to the output terminal ISO and the peak value VC4 of the DC voltage of the output signal delivered to the output terminal OUT of the coupler.

And, the phase of the signal SG2 is adjusted until obtaining an absolute value of this difference that is zero or almost zero (within a tolerance for example equal to a few mV, which then allows to determine the calibrated phase and therefore the phase shift between the two signals SG1 and SG2.

Figure 5:
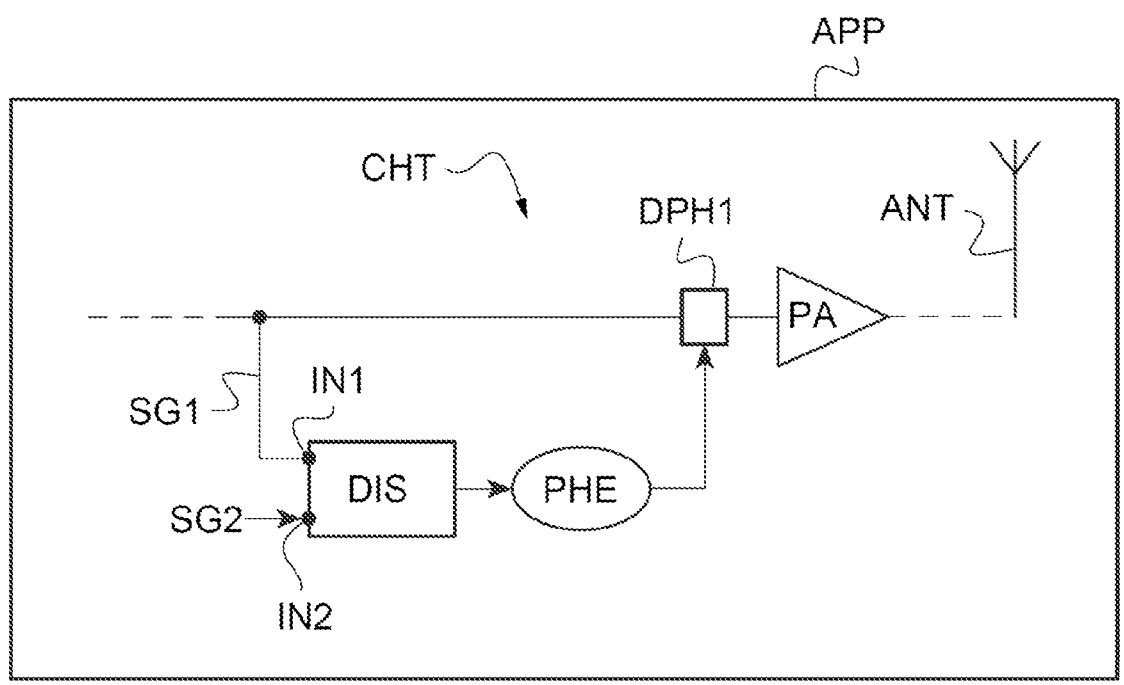

FIG. 5 schematically illustrates a communication apparatus APP, for example a cellular mobile telephone, comprising an emission chain CHT including a power amplifier PA and a device DIS as described above.

In the example described here, the device DIS is used to determine, for example, the phase shift created upstream of the power amplifier PA.

The device DIS then receives the signal SG1 coming from the emission chain and the signal SG2, which can be a reference signal or else for example in the case of a beamforming application, the signal coming from another emission channel.

The device DIS then provides the phase shift PHE between the two signals SG1 and SG2.

It is then possible to correct this phase shift in a phase shifter DPH1 coupled upstream of the amplifier PA to obtain a desired effective phase shift, which is zero or not, upstream of the amplifier PA.

Of course, it is possible to perform the same operation downstream of the power amplifier PA.

This calibration can be performed in the laboratory after mounting all the Detailed Description of Illustrative Embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for determining a phase shift between a first signal and a second signal, the method comprising:
    delivering the first signal to a first input of a 90° hybrid coupler;
    delivering the second signal to a second input of the 90° hybrid coupler;
    determining a first piece of information relating to a power of a first output signal delivered to a first output of the 90° hybrid coupler;
    determining a second piece of information relating to a power of a second output signal delivered to a second output of the 90° hybrid coupler; and
    adjusting a phase of the second signal until obtaining a calibrated phase for which the first piece of information is substantially equal to the second piece of information, wherein the first and second signals have identical frequencies, and wherein the phase shift between the first signal and the second signal is equal to the calibrated phase.

2. The method of claim 1, wherein determining the first piece of information comprises determining a first peak value of a DC voltage of the first output signal, wherein determining the second piece of information comprises determining a second peak value of a DC voltage of the second output signal, and wherein obtaining the calibrated phase corresponds to a difference which is substantially zero between the first and second peak values.

3. The method of claim 2, wherein determining the first peak value of the DC voltage of the first output signal comprises using a first peak detector coupled to the first output of the 90° hybrid coupler, wherein determining the second peak value of the DC voltage of the second output signal comprises using a second peak detector coupled to the second output of the 90° hybrid coupler, and wherein a third and fourth peak detectors are coupled to the first and second inputs of the 90° hybrid coupler, respectively.

4. The method of claim 3, wherein the first, second, third, and fourth peak detectors are identical to each other.

5. The method of claim 2, wherein determining the first peak value of the DC voltage of the first output signal comprises:
receiving the first output signal via a capacitor with a control terminal of a first transistor;
mirroring a reference current with a current mirror that is coupled to a current path of the first transistor; and
delivering the first peak value of the DC voltage at a node coupled to the current path of the first transistor and to further coupled to an output capacitor.

6. The method of claim 1, wherein the first and second signals are radiofrequency signals.

7. The method of claim 6, wherein the first and second signals are millimeter-wave signals.

8. A device for determining a phase shift between a first signal and a second signal, the device comprising:
a 90° hybrid coupler having a first input configured to receive the first signal, a second input configured to receive the second signal, a first output configured to deliver a first output signal, and a second output configured to deliver a second output signal;
a first circuit configured to determine a first piece of information relating to a power of the first output signal;
a second circuit configured to determine a second piece of information relating to a power of the second output signal; and
an adjustment circuit configured to adjust a phase of the second signal until obtaining a calibrated phase for which the first piece of information is substantially equal to the second piece of information, the phase shift between the first signal and the second signal being equal to the calibrated phase, wherein the first and second signals have identical frequencies.

9. The device of claim 8, wherein the first circuit comprises a first peak detector coupled to the first output of the 90° hybrid coupler and configured to determine a first peak value of a DC voltage of the first output signal, wherein the second circuit comprising a second peak detector coupled to the second output of the 90° hybrid coupler and configured to determine a second peak value of a DC voltage of the second output signal, wherein the calibrated phase corresponds to a substantially zero difference between the first and second peak values.

10. The device of claim 9, further comprising two other peak detectors respectively coupled to the first input and to the second input of the 90° hybrid coupler.

11. The device of claim 9, wherein the first and second signals are radiofrequency signals.

12. The device of claim 9, wherein the first peak detector comprises:
an output terminal;
an output capacitor coupled to the output terminal of the first peak detector;
a first transistor having a control terminal capacitively coupled to the first output of the 90° hybrid coupler, and a current path coupled between a first supply terminal and the output terminal; and
a current mirror coupled to the current path of the first transistor.

13. A communication apparatus comprising:
an emission chain comprising a power amplifier; and
a device disposed upstream or downstream of the power amplifier, the device comprising:
a 90° hybrid coupler having a first input configured to receive a first signal, a second input configured to receive a second signal, a first output configured to deliver a first output signal, and a second output configured to deliver a second output signal,
a first circuit configured to determine a first piece of information relating to a power of the first output signal,
a second circuit configured to determine a second piece of information relating to a power of the second output signal, and
an adjustment circuit configured to adjust a phase of the second signal until obtaining a calibrated phase for which the first piece of information is substantially equal to the second piece of information, wherein a phase shift between the first signal and the second signal is equal to the calibrated phase, wherein the first and second signals have identical frequencies.

14. The communication apparatus of claim 13, wherein the emission chain further comprises a phase shifter having a first input configured to receive the first signal, a second input configured to receive the calibrated phase, and an output coupled to an input of the power amplifier.

15. The communication apparatus of claim 13, wherein the first circuit comprises a first peak detector coupled to the first output of the 90° hybrid coupler and configured to determine a first peak value of a DC voltage of the first output signal, wherein the second circuit comprising a second peak detector coupled to the second output of the 90° hybrid coupler and configured to determine a second peak value of a DC voltage of the second output signal, wherein the calibrated phase corresponds to a substantially zero difference between the first and second peak values.

16. The communication apparatus of claim 15, further comprising two other peak detectors respectively coupled to the first input and to the second input of the 90° hybrid coupler.

17. The communication apparatus of claim 15, wherein the first and second signals are radiofrequency signals.

18. The communication apparatus of claim 15, wherein the first peak detector comprises:
an output terminal;
an output capacitor coupled to the output terminal of the first peak detector;
a first transistor having a control terminal capacitively coupled to the first output of the 90° hybrid coupler, and a current path coupled between a first supply terminal and the output terminal; and
a current mirror coupled to the current path of the first transistor.

19. The communication apparatus of claim 13, wherein the communication apparatus is a mobile telephone.

20. The communication apparatus of claim 13, wherein the frequencies of the first and second signals are comprised between 10 GHz and 80 GHz.

* * * * *